United States Patent [19]

Santandrea et al.

[11] Patent Number: 4,777,446

[45] Date of Patent: Oct. 11, 1988

[54] MACHINE FOR THE AUTOMATIC TESTING OF ELECTRIC MOTOR ROTORS

[75] Inventors: Luciano Santandrea, Tavarnelle Val Di Pesa; Massimo Lombardi, Casellina, both of Italy

[73] Assignee: AXIS S.p.A., Florence, Italy

[21] Appl. No.: 842,179

[22] Filed: Mar. 21, 1986

[30] Foreign Application Priority Data

Sep. 27, 1985 [IT] Italy ................................. 22293 A85

[51] Int. Cl.$^4$ ............................................. G01R 31/34
[52] U.S. Cl. ..................................... 324/545; 324/558; 324/158 MG
[58] Field of Search ....... 324/545, 555, 558, 158 MG; 118/713, 712, 670; 346/33 F

[56] References Cited

U.S. PATENT DOCUMENTS

| | | | |
|---|---|---|---|
| 2,566,767 | 9/1951 | Hunt | 209/81 |
| 3,197,781 | 7/1965 | Crouch | 346/33 F |
| 3,675,118 | 7/1972 | Booth | 324/226 |
| 3,898,560 | 8/1975 | Farreras et al. | 324/158 MG |
| 4,377,784 | 3/1983 | Saito et al. | 324/545 |
| 4,393,386 | 7/1983 | DiGiulio | 346/75 |
| 4,517,436 | 5/1985 | Lawrence | 242/75.5 |

FOREIGN PATENT DOCUMENTS 1402857 8/1975 United Kingdom .

OTHER PUBLICATIONS

Elektrotechnik, vol. 58, No. 22, pp. 43–46, "Anker vom Fliessband" by A. Polzlbauer.

Primary Examiner—Reinhard J. Eisenzopf
Assistant Examiner—Anthony L. Miele
Attorney, Agent, or Firm—Stevens, Davis, Miller & Mosher

[57] ABSTRACT

A machine for the automatic testing of electric motor rotors comprises a system for checking various characteristics of rotors arriving from a line of production thereof, in which system there are preset theoretical values of the various characteristics to be detected which are compared with the values detected on each rotor. Also provided in the machine is a display apparatus and/or a printer of the detected values, as well as a system of identification, in the tested rotor, of the type of characteristic whose detected value differs beyond an acceptable field of tolerance from the preset theoretical value.

6 Claims, 2 Drawing Sheets

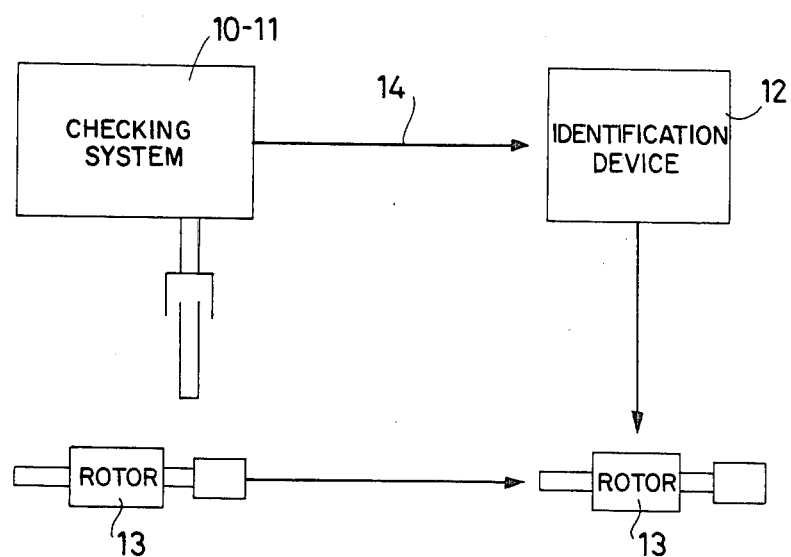

MACHINE FOR THE AUTOMATIC TESTING OF ELECTRIC MOTOR ROTORS

This invention relates to a machine for the automatic testing of electric motor rotors.

BACKGROUND OF THE INVENTION

After having terinated the manufacture of the rotors, and before they are conveyed to the line of utilization, it is necessary to carry out tests on the rotors, which will enable to separating the good rotors from those which have to be rejected.

It is also necessary for the machine which carries out the various tests on the stators, to be capable of signalling to the operator the reasons for which the stators have to be rejected as being unfit for the use.

It is also advantageous that the testing operations performed by the machine be carried out under the direct control of an operator by means of video terminal, with the aid of which the operator selects the functions to be performed and/or receives the results of the tests which have been carried out.

The object of the invention is to provide a machine which will have all the characteristics mentioned above and will allow carrying out the tests concerning some parameters or fundamental elements of the rotor in order ot obtain a good operation of this latter in the motor in which it will be installed.

SUMMARY OF THE INVENTION

To attain these and other objects which will be more clearly apparent from the following description the invention proposes to provide a machine for the automatic testing of electric motor rotors, characterized in comprising:
- first means for presetting the theoretical characteristics of the rotors;
- second means for detecting said characteristics on rotors placed at the end of the production line along which they are fed, which second means are associated with third comparison means which compare the detected characteristics with those which have been preset, in order to visualize and/or identify differences between the values of the characteristics;
- fourth means for determining on each rotor a pre-established code corresponding to the type of the detected characteristic which differs, beyond an acceptable tolerance range, from the corresponding pre-determined characteristic.

BRIEF DESCRIPTION OF THE DRAWINGS

The machine according to the invention will now be described with reference to the annexed drawings, in which:

FIG. 2 is an assembly diagram of the machine in operative condition.

DESCRIPTION OF THE PREFERRED EMBODIMENTS

The most significant tests to be performed on the rotors are those intended to detect the following possible defects:

defective insulation between commutator, pack and shaft;

short-circiut turns, short-circuit coils, discharge between adjacent turns due to losses of insulation;

wrong resistance of the coils;

defect on the connected between wire and hook;

wrong winding diagram or wrong geometry of connection of the coils to the commutator.

It is clear that these tests, considered as being the most useful, may not all of them be carried out, or may be integrated by other tests, because the object of the invention is not the provision of a machine capable of carrying out certain tests on the rotors, but that of a machine which will signal the tests carried out and will allow to reject the rotors on the ground of the defects eventually found on them in relation with the tests which have carried out.

Anyway, as the tests indicated above seem to be the most important and necessary for carrying out a complete test of the rotor, in this description reference will be made to said tests by way of example.

For convenience of description, the tests carried out by the machine will be defined as follows:

AB=measurement of the resistance of the coils

RS=resistance of contact between wire and hook or welding carried out with the so-called welding resistance measurement HV (HV1 and HV2)=indicates the tests of simple (HV1) or double (HV2) insulation between commutator and pack and between shaft and pack, checked by measuring with high voltages the leakage current between said points ST=electromagnetic goodness of the windings and the piece on the whole, detected through the "Surge" test by which the coils and the individual turns are loaded in order to detect short-circuits between the commutator bars, between the turns of a coil ZN=correct geometry of manufacture of the winding, detected by the so-called Neutral Zone test aiming to detect a wrong winding diagram on the piece as compared with a programmed diagram (sample).

Figure 1:
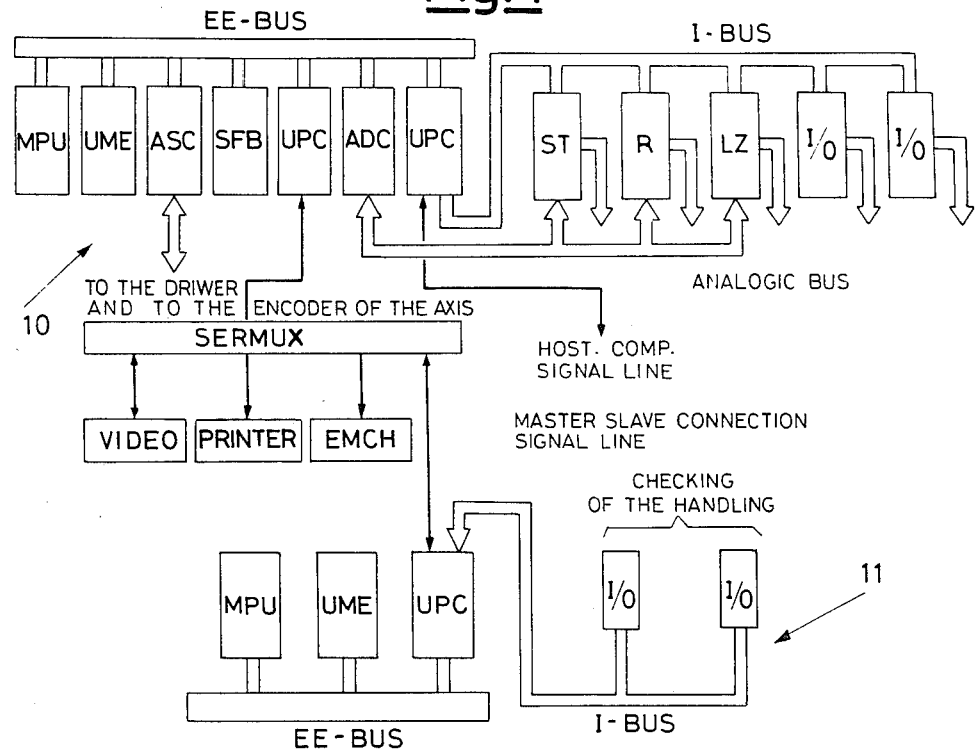
FIG. 1 is a block diagram of an element forming the machine.
Figure 1A:
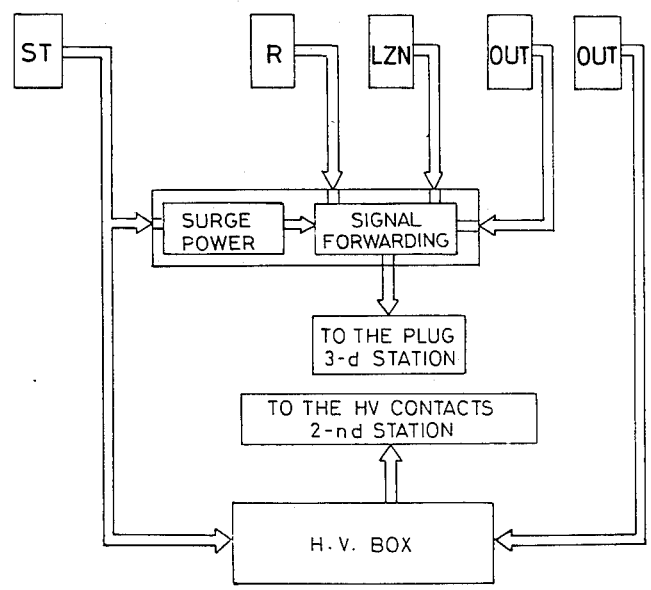
FIG. 1a is an amplified block diagram of detail of FIG. 1.

Thus, the machine of the invention incorporates an electronic checking system formed by two intelligent parts which colloquise with one another on a serial line. Said two parts are the measurement controller or Master 10 and the handling controller or Slave 11, shown in block diagram in FIG. 1. The components of the checking system are a follows:

MPU=Card CPU of the Bus

ASC=Control card AXIS in position with a DC motor

UME=RAM/EPROM memory card

SFB=Card with calender clock

ADC=Analogic-digital conversion card

UPC=Card with serial interface and parallel interface

SERMUX=Multiplexer of serial lines

EE-BUS=Hihg-speed data transfer Bus

I/BUS=Reduced speed and high immunity industrial Bus, controlled by a parallel post of a UPC ST,R,LZN=Cards for the conditioning of the analogic signals concerning the Surge and HV (card ST), RB and RS (card R), Neutral Zone and Temperature (LZN) measurements I/O=Cards of 24 Vdc industrial inputs/outputs BOX H.V.=Power box for HV measurements. Contains a voltage generator for the test.

BOX FOR THE SURGE TEST FOR THE SIGNAL FORWARDING=Contains the power generator for the Surge test and the forwardig of the signals of the various tests towards the plug.

The rotors to be checked move along stations.

The first station is the one in which the loading/unloading of the rotors is carried out;

station 2 is that in which the "insulation" test, called also High Voltage or H.V. (high voltage) test is carried out;

station 3 is the one in which all the other measurements are carried out, and this station contains a d.c. servomotor which rotats the tap clamp of the piece so as to position beneath the contacts of the plug the coil or coils to be tested. Each Coil Resistance measurement (called also RB), Welding Resistance measurement (called also RS) and Surge measurement (called also ST=initials of Surge Test), are carried out on each coil individually and not at 180° on the commutator or by groups of coils, in order to exert a higher load onto the coil which is being tested.

In this station is carried out also the Neutral Zone measurement (ZN).

The results of the measurements are displayed on video terminals and printed in different sizes depending on whether they are carried out in an automatic cycle or manually.

At the same time, the machine, in a first embodiment thereof, comprises a labelling machine which performs the labelling of the rotors to be rejected, before they are removed by the operator.

Stamped on each lable is the indication of the tpye of failure, as well as a progressive number representing the number of the piece to which corresponds the analogous printing in the tabulation of the printer.

The initials which indicate the rejection, in the case of the tests listed hereinabove, may be: HV1, HV2, ZN, RS, RB, ST, i.e. the type of test by which the anomaly on the rotor has been detected.

The labelling machine is only a type of a empoyable identification device 12 (FIG. 2) which seems to be particularly advantageous since it is reliable and economical; however, such device may also be formed by an ink jet writing system or by a laser marking system, having, they too, the task of reproducing on the rotor (13) the code of the test which has determined the reason for which the rotor has been rejected.

In this way a complete machine diagrammatically shown in FIG. 2 is obtained, in which the checking system 10-11 performs the tests on the rotor 13 and transmits the rejection information, through a transmission line 14, to an identification device 12 (labelling machine, ink applicator, laser, etc.) which indicates the code marked on the rotor on which the tests have been carried out, and is positioned in register with the device 12.

We claim:

1. A machine for automatically testing types of characteristics of electric motor rotors, comprising:

first means for presetting theoretical values for types of characteristics of the rotors prior to beginning of testing of said types of characteristics and prior to detection of actual values for said types of characteristics on the rotors to be tested;

second means for detecting actual values for said types of characteristics on rotors placed at an end of a production line along which they are fed, third means for comparison of values of detected types of characteristics with said theoretical values which have been preest, in order to visualize and/or identify differences between actual and theoretical values of the types of characteristics; and fourth means for indicating on each rotor a pre-established code corresponding to the value of the type of the detected characteristic which differs, beyond an acceptable tolerance range, from the corresponding preset theoretical value of the type of characteristic.

2. The machine as claimed in claim 1, wherein said first means has preset therein theoretical values for types of characteristics detectable on a perfect rotor.

3. The machine as claimed in claim 1, wherein said differences between the preset theoretical values and the values detected on the manufactured rotors are displayed, printed and transmitted to said fourth means.

4. The machine as claimed in claim 1, wherein said fourth means comprises a labelling machine which applies on the rotor a code reflecting the value of a type of characteristic detected which differs, beyond an acceptable tolerance, from the preset theoretical value.

5. The machine as claimed in claim 1, characterized in that said fourth means comprises an ink jet device which inks on the rotor a code reflecting the value of a type of characteristic detected which differs, beyond an acceptable tolerance, from the preset theoretical value.

6. The machine as claimed in claim 1, characterized in that said fourth means comprises a laser device which marks on the rotor a code reflecting the value of a type of characteristic detected which differs, beyond the acceptable tolerance, from the preset theoretical value.

* * * * *